US 6,524,168 B2

(12) United States Patent
Luo et al.

(10) Patent No.: US 6,524,168 B2
(45) Date of Patent: Feb. 25, 2003

(54) COMPOSITION AND METHOD FOR POLISHING SEMICONDUCTORS

(75) Inventors: Qiuliang Luo, Newport Beach, CA (US); James Shen, Portland, OR (US)

(73) Assignee: Rodel Holdings, Inc, Wilmington, DE (US)

( * ) Notice: Subject to any disclaimer, the term of this patent is extended or adjusted under 35 U.S.C. 154(b) by 112 days.

(21) Appl. No.: 09/882,453

(22) Filed: Jun. 15, 2001

(65) Prior Publication Data

US 2002/0043026 A1 Apr. 18, 2002

Related U.S. Application Data

(60) Provisional application No. 60/211,603, filed on Jun. 15, 2000.

(51) Int. Cl.⁷ .................................................. B24B 1/00
(52) U.S. Cl. ........................................... 451/41; 451/36
(58) Field of Search ............................ 451/41, 36, 28, 451/56, 37; 51/307, 308, 309; 106/3; 438/690, 692, 693

(56) References Cited

U.S. PATENT DOCUMENTS

| 5,314,748 | A | * | 5/1994 | Mazurek et al. ............ 451/345 |
| 5,972,792 | A |   | 10/1999 | Hudson |
| 5,993,686 | A |   | 11/1999 | Streinz et al. |
| 5,994,224 | A |   | 11/1999 | Sandhu et al. |
| 6,033,596 | A |   | 3/2000 | Kaufman et al. |
| 6,039,891 | A |   | 3/2000 | Kaufman et al. |
| 6,040,245 | A |   | 3/2000 | Sandhu et al. |
| 6,217,416 | B1 | * | 4/2001 | Kaufman et al. ............. 451/41 |
| 6,444,633 | B2 | * | 9/2002 | Price .......................... 510/299 |
| 6,447,371 | B2 | * | 9/2002 | Brusic Kaufman et al. ... 451/36 |

FOREIGN PATENT DOCUMENTS

WO        WO 99/61540        12/1999

* cited by examiner

*Primary Examiner*—Lee Wilson
(74) *Attorney, Agent, or Firm*—Gerald K. Kita

(57) ABSTRACT

An aqueous polishing composition for chemical mechanical polishing of semiconductor devices of silica and circuits of aluminum, titanium or titanium nitride; wherein said aqueous composition includes, an oxidizing agent, an inhibitor of a polyalkyleneimine, and a pH buffer, and a method for polishing a semiconductor device by applying the polishing composition at an interface between a polishing pad and the semiconductor device.

10 Claims, No Drawings

COMPOSITION AND METHOD FOR POLISHING SEMICONDUCTORS

CROSS REFERENCE TO RELATED APPLICATION

This application claims the benefit of provisional application No. 60/211,603, filed Jun. 15, 2000.

BACKGROUND OF THE INVENTION

1. Field of the Invention

The present invention relates to compositions that are useful as polishing compositions for chemical-mechanical polishing of semiconductors. More specifically, the polishing compositions of the present invention include an aqueous medium, an oxidizing agent, an inhibitor and a pH buffer.

2. Description of Related Art

Methods for chemical mechanical polishing and planarization of substrates used in the formation of semiconductors using abrasive slurries are shown in Sandhu et al U.S. Pat. Nos. 5,994,224 issued Nov. 30, 1999, Streinz et al 5,993,686 issued Nov. 30, 1999, Kaufman et al 6,039,891 issued Mar. 21, 2000, Sandhu et al 6,040,245 issued Mar. 21, 2000. Chemical mechanical polishing methods using non-abrasive containing polishing compositions are shown in Hudson U.S. Pat. No. 5,927,792 issued Oct. 26, 1999 and in WO 99/61540 published Dec. 2, 1999.

In chemical mechanical polishing of semiconductors comprising silica having circuits therein of aluminum, titanium or titanium nitride, a polishing composition is required that results in a very low level of defects and provides a higher level of polishing performance than can be achieved with prior art polishing compositions that contain abrasives or that do not contain abrasives but other combinations of polishing components. Dishing of the metallic circuit of the semiconductor has been a problem with conventional polishing composition particularly those containing abrasives. Dishing of the metallic circuit occurs when significantly more of the center portion of a metallic circuit of a semiconductor is removed than is removed from the sides resulting in a dip in the circuit that is below the level of the surface of the semiconductor. A polishing composition and method are required that has an acceptable removal rate of material, does not result in scratching the surface of the semiconductor or in dishing of the metallic circuit of a semiconductor and provides excellent planarization of the surface of the semiconductor that is being polished.

SUMMARY OF THE INVENTION

An aqueous polishing composition for chemical mechanical polishing of semiconductor devices comprising silica and circuits of aluminum, titanium or titanium nitride; wherein said aqueous composition comprises an oxidizing agent such as an alkali metal chlorate or hydrogen peroxide, an inhibitor of a polyalkyleneimine, and a pH buffer such as ammonium phosphate or an alkali metal carbonate and optionally, a complexing agent, oxide suppressants and other inhibitors can be added.

A further aspect of this invention is a method for polishing a semiconductor device comprised of silica and circuits of aluminum, titanium or titanium nitride by applying the novel aqueous a polishing composition at an interface between a polishing pad and the semiconductor device.

DETAILED DESCRIPTION

The aqueous polishing composition of this invention is used to polish semiconductor devices of a silica wafer having circuits therein of aluminum, titanium or titanium nitride. The composition when used in a typical polishing process provides excellent planarization of the surface, does not scratch the surface and in particular does not dish the metallic circuit but polishes it evenly and at about the same level as the silica substrate. The composition can be used in combination with a variety of conventional polishing pads that are used on typical polishing machines.

The novel aqueous polishing composition contains about 0.0001–30%, based on the weight of the composition, of an oxidizing agent; about 0.0001–15% by weight, based on the weight of the composition, of an inhibitor; and 0.0001–5.0% by weight, based on the weight of the composition, of a pH buffer to provide the composition with a pH in the range of about 2–11. Optionally, a complexing agent, oxide suppressants and other inhibitors can be added to the composition.

Typical oxidizing agents that can be used are alkali metal chlorates such as potassium chlorate; and other oxidizing agents can be used such as ammonium chlorate, potassium iodate, ammonium perchlorate, potassium hyperchlorite, ammonium hyperchlorite, potassium chlorite, ammonium chlorite and the like. Hydrogen peroxide also is a useful oxidizing agent. The oxidizing agent oxidizes the surface of the metal circuit so that the metal is readily removed in the polishing process.

The inhibitor is a polyalkyleneimine having a weight average molecular weight of about 1,000–1,000,000. Preferably, polyethyleneimine is used. The inhibitor forms an inhibitor layer or a passivation layer on a metal substrate being polished such a aluminum and protects the substrate from dissolution during polishing and reducing dishing of the substrate. Depending on the pH of the polishing composition, the inhibitor layer can be a layer of aluminum oxide or a layer of an aluminum inhibitor polymeric film. At pH 4–9, the inhibitor layer is mainly aluminum oxide. When the pH is less than 2 or higher than 9, this inhibitor layer is an aluminum inhibitor polymeric film. The inhibitor layer is formed by the adsorption of inhibitor onto the aluminum surface through chemical bonding. When an organic inhibitor is used, such as polyethyleneimine, a polymeric inhibitor layer is formed and the thickness of the layer is built up by hydrogen bonding. The inhibitor layer can only be removed by mechanical abrasion and the removal rate of material during polishing is very low which results in a low level of dishing of the aluminum. Similar results occur when polishing titanium and titanium nitride since the surface of these compounds mainly is titanium oxide.

A pH buffer is used to keep the polishing composition at a pH of 2–11, preferably in the range of 4–9. Typical compounds that can be used are ammonium phosphate, ammonium hydrogen phosphate, potassium carbonate, ammonium tetraborate and potassium tetraborate.

About 0.0001–10% by weight, based on the weight of the composition, of an oxide suppressant can be added to the polishing composition. Typical oxide suppressants that can be used are organic bromides such as dodecyl trimethylammonium bromide. Under some circumstances, a polyalkyleneimines such as polyethyleneimine can function as an oxide suppressant. For example, when silicon dioxide is polished the polyalkyleneimine functions as an oxide suppressant.

Other inhibitors can be added to the polishing composition so long as the total amount of inhibitor including the polyalkyleneimine does not exceed 15% by weight of the polishing composition. Typical inhibitors that can be added to the polishing composition are inorganic compounds like phosphoric acid, phosphoric acid salts, carbonate salts, boric acid, boric acid salts, chromate salts, silicate salts, or organic compounds containing nitrogen, silicon, and or oxygen. Organic compounds also can be used. Typical organic compounds are benzoic acid and salts of benzoic acid. By using these inhibitors, the pH of the slurry can be extended to 2–11. Some of the above compositions like salts of acids can function as pH buffers in particular the salts of phosphoric and boric acids.

Optionally, about 0.0001–30% by weight, based on the weight of the composition, of a complexing agent can be added to the composition. Typical complexing agents that can be used are citric acid, ethylenetetraacetic acid, imnodiacetic acid, and nitrilotriacetic acid. The complexing agent dissolves the metal oxide formed by the oxidizing agent and it is readily removed in the dissolved state during the polishing process. A complexing agent is not required for composition having a high pH such as 10 and above since the hydroxy ions in the composition act as a complexing agent and no additional complexing agent is required.

In the formulation of the polishing composition, the constituents can be blended together in any order. A variety of polishing pads can be used with the polishing composition that are conventionally used in polishing semiconductors. One preferred polishing pad is a fixed abrasive pad SWR 159 manufactured by the 3 M Company. Also, a wide variety of polishing machines can be used. One typically useful machine is a Westech 372.

The following examples illustrate the invention. All parts and percentages are on a weight basis unless otherwise indicated.

EXAMPLES

Example 1

Polishing Composition 1

The following constituents were blended together to form the polishing composition:
3 parts ammonium hydrogen phosphate
1 part polyethyleneimine (PEI) weight average molecular weight 750,000
7.5 parts hydrogen peroxide
88.5 parts water.
The resulting composition has a pH of 10.

Polishing Composition 2—identical to Polishing Composition 1 except PEI was omitted.

Each of the above Polishing Compositions was used to polish (1) a test TEOS wafer and (2) an aluminum wafer. An aluminum wafer consists of a sputtered aluminum film deposited on a thermally grown silicon dioxide on a silicon substrate. A TEOS wafer is a test wafer that consists of silicon dioxide deposited on a silicon substrate by chemical vapor deposition.

For polishing, a Westech 372 polishing machine was used and the following polishing conditions were used: 4 psi down force, 2 psi back pressure, 40 rpm polishing platen speed. The polishing pad used was a fixed abrasive pad SWR 159 manufactured by 3 M Company.

The polishing results of the Polishing Compositions 1 and 2 were as follows:

Polishing Composition 1 (Invention)
Aluminum Wafer
Removal rate of aluminum for 3 continuous polishing runs was 1404, 1113, and 1163 A/min., respectively. The average removal rate of aluminum was 1227 A/min.
TEOS Wafer
TEOS removal rate is 0 A/min. of silicon dioxide.
Finish of Surface—no visible scratches were observed on either the aluminum wafer or the TEOS wafer.

Polishing Composition 2 (PEI Omitted)
Aluminum Wafer
Removal rate was about 4 microns/min.
TEOS Wafer
TEOS removal rate is 0 A/min. of silicon dioxide
Finish of Surface—unacceptable for both wafers, since many surface scratches were present due to high friction. PEI is required as in Polishing Composition 1 to reduce friction and provide scratch free polishing.

Although embodiments of the invention have been described, other embodiments and modifications are intended to be covered by the spririt and scope of the appended claims.

What is claimed is:

1. An aqueous polishing composition for chemical mechanical polishing of semiconductor devices comprising silica and metal circuits wherein the metal is selected from the group consisting of aluminum, titanium or titanium nitride; wherein said aqueous composition comprises
   a. an oxidizing agent,
   b. an inhibitor comprising polyalkyleneimine and
   c. pH buffer.

2. The aqueous polishing composition of claim 1 wherein the inhibitor consists of polyethyleneimine having a weight average molecular weight of 1,000–1,000,000.

3. The aqueous polishing composition of claim 1 in which oxidizing agent is selected from the group consisting of potassium chlorate, ammonium chlorate, potassium iodate, ammonium perchlorate, potassium hyperchlorite, ammonium hyperchlorite, potassium chlorite, ammonium chlorite and hydrogen peroxide.

4. The aqueous polishing composition of claim 1 in which the pH buffer is selected from the group consisting of ammonium phosphate, ammonium hydrogen phosphate, potassium carbonate, ammonium tetraborate and potassium tetraborate.

5. The aqueous polishing composition of claim 1 consisting essentially of an oxidizing agent consisting of hydrogen peroxide, an inhibitor consisting of polyethyleneimine having a weight average molecular weight of 1,000–1,000,000 and a pH buffer consisting of ammonium hydrogen phosphate.

6. The aqueous polishing composition of claim 1 consisting essentially of about 0.0001–30.0% by weight, based on the weight of the polishing composition, of an oxidizing agent, 0.0001–15% by weight, based on the weight of the polishing composition, of an inhibitor, and 0.0001–5.0% by weight, based on the weight of the polishing composition, of a pH buffer and the composition has pH of about 2–11.

7. The aqueous polishing composition of claim 1 containing in addition an oxide suppressant.

8. The aqueous polishing composition of claim 1 containing in addition a complexing agent.

9. The composition of claim 8 in which the complexing agent is selected from the group consisting of citric acid, ethylenetetraacetic acid, imnodiacetic acid and nitrilotriacetic acid.

10. A process for chemical mechanical polishing of semiconductor devices comprising silica and circuits of a metal selected from the group consisting of aluminum, titanium or titanium nitride which comprises applying the aqueous a polishing composition at an interface between a polishing pad and the semiconductor device;
wherein the aqueous polishing composition comprises an oxidizing agent, an inhibitor comprising polyalkyleneimine and pH buffer.

* * * * *